United States Patent
Tseng et al.

(10) Patent No.: US 9,385,656 B2
(45) Date of Patent: Jul. 5, 2016

(54) LOW COMPLEXITY FREQUENCY SELECTIVE IQ MISMATCH DIGITAL RX BALANCER AND TX INVERSE BALANCER FOR NON-IDEAL RF FRONT-END

(75) Inventors: Ching-Yih Tseng, Milpitas, CA (US); Wen-Sheng Cheng, Taipei (TW)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 586 days.

(21) Appl. No.: 13/294,129

(22) Filed: Nov. 10, 2011

(65) Prior Publication Data

US 2013/0121388 A1     May 16, 2013

(51) Int. Cl.
*H04B 1/38*     (2015.01)
*H03D 3/00*     (2006.01)
*H04B 1/04*     (2006.01)

(52) U.S. Cl.
CPC .............. *H03D 3/009* (2013.01); *H04B 1/0475* (2013.01)

(58) Field of Classification Search
CPC ............... H04B 1/0475; H04B 1/1027; H04B 2001/0425; H04B 15/00; A61B 8/56; H03F 2200/336; H03F 1/3294; H03H 17/04
USPC ............................ 375/221, 296, 346; 455/501
See application file for complete search history.

(56) References Cited

U.S. PATENT DOCUMENTS

| | | | |
|---|---|---|---|
| 2004/0193965 A1* | 9/2004 | Coersmeier | 714/48 |
| 2006/0291590 A1* | 12/2006 | Elahi et al. | 375/332 |
| 2010/0104045 A1* | 4/2010 | Santraine et al. | 375/324 |
| 2010/0330941 A1* | 12/2010 | Trikha et al. | 455/180.1 |
| 2011/0013724 A1* | 1/2011 | Metreaud et al. | 375/296 |
| 2011/0069744 A1* | 3/2011 | Laudel et al. | 375/219 |
| 2011/0069767 A1* | 3/2011 | Zhu | 375/259 |
| 2012/0093264 A1* | 4/2012 | Yamaguchi | 375/340 |
| 2012/0140807 A1* | 6/2012 | Chatterjee et al. | 375/224 |

* cited by examiner

*Primary Examiner* — Leila Malek
(74) *Attorney, Agent, or Firm* — Oliff PLC

(57) ABSTRACT

A system for reducing a mismatch between an in-phase (I) signal and a quadrature phase (Q) signal is disclosed. The system includes a phase compensation block comprising an infinite impulse response (IIR) filter configured to reduce a first portion of a mismatch between an I signal and a Q signal, wherein the first portion includes frequency selective phase mismatch. The system further includes a gain compensation block comprising a finite impulse response (FIR) filter configured to reduce a second portion of the mismatch, wherein the second portion includes frequency selective gain mismatch. The phase compensation block and the gain compensation block are calibrated at least in part based on a loopback signal, wherein the loopback signal is routed from a transmitting portion of a radio frequency (RF) circuitry back to a receiving portion of the RF circuitry.

35 Claims, 16 Drawing Sheets

LOW COMPLEXITY FREQUENCY SELECTIVE IQ MISMATCH DIGITAL RX BALANCER AND TX INVERSE BALANCER FOR NON-IDEAL RF FRONT-END

BACKGROUND OF THE INVENTION

The proliferation of wireless communication systems has led to a demand for low cost and high efficiency radio implementations. Tolerances in the components of the radio transmit and receive chains (including, for example, mixers, low pass filters (LPF) and analog to digital converters) introduce an imbalance or mismatch between the in-phase (I) and the quadrature phase (Q) components of the communication signal. In particular, the magnitudes of the I and Q signals are not equal and the phases of the I and Q signals are not ninety degrees apart. This IQ imbalance, including both a frequency selective component and a non-frequency selective component, can impact the reliability of communication if not addressed. Accordingly, there is a need for improved techniques for correcting the frequency selective and non-frequency selective components of IQ mismatch that is computationally efficient.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
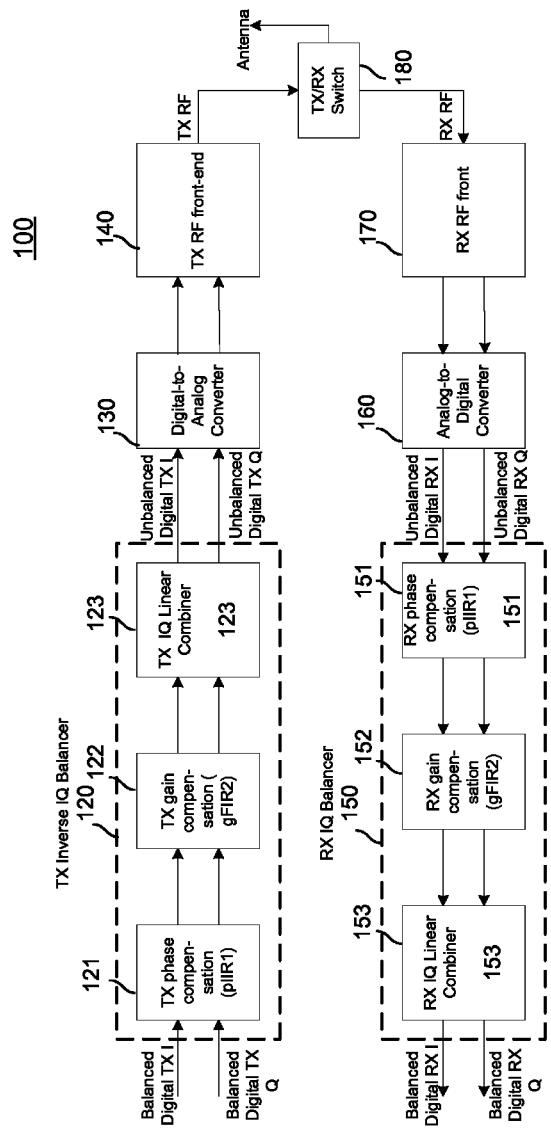
FIG. 1 is a block diagram illustrating an embodiment of a radio system 100.

FIG. 1 is a block diagram illustrating an embodiment of a radio system 100. In the upper branch of radio system 100, a transmit (TX) inverse IQ balancer 120 is used for digitally calibrating the TX radio frequency (RF) front-end frequency selective IQ gain and phase mismatches. In this transmit chain, TX inverse IQ balancer 120 pre-distorts the balanced digital TX in-phase (I) and quadrature-phase (Q) signals to generate the unbalanced digital TX I/Q signals, which are then fed into a Digital-to-Analog Converter (DAC) 130. DAC 130 produces pre-distorted analog I/Q signals, which are further fed into a TX RF front-end 140. The TX RF front-end, which is non-ideal and has frequency selective IQ mismatches, up converts the baseband signal to the desired RF band. TX inverse IQ balancer 120 includes a transmit phase compensation block 121, a transmit gain compensation block 122, and a transmit IQ linear combiner 123. These three components of TX inverse IQ balancer 120 contain a total of four coefficients that are selected to provide proper pre-distortion to compensate for the unbalanced IQ that results from the up-conversion by the non-ideal TX RF front-end. As will be described in greater detail below, transmit phase compensation block 121 is configured to reduce frequency selective IQ phase mismatch; transmit gain compensation block 122 is configured to reduce frequency selective IQ gain mismatch; and transmit IQ linear combiner 123 is configured to reduce any remaining non-frequency selective IQ gain and phase mismatches.

In the lower branch of radio system 100, a receive (RX) IQ balancer 150 is used for digitally calibrating the RX RF front-end frequency selective IQ gain and phase mismatches. In this receive chain, the RF signal is down-converted by a RX RF front-end 170 to unbalanced analog baseband in-phase (I) and quadrature-phase (Q) signals. The RX RF front-end 170 is non-ideal and has frequency selective IQ mismatches. The IQ signals are digitized by an Analog-to-Digital Converter (ADC) 160 and presented to RX IQ balancer 150 as unbalanced digital RX IQ signals. RX IQ balancer 150 processes the unbalanced digital IQ signals and produces balanced digital IQ signals through the use of a receive phase compensation block 151, receive gain compensation block 152 and receive IQ linear combiner 153. Similar to the TX transmitting chain, the three components of RX IQ balancer 150 contain a total of four coefficients that are selected to provide proper compensation to remove the unbalanced IQ effect caused by the down-conversion in the non-ideal RX RF front-end 170. As will be described in greater detail below, receive phase compensation block 151 is configured to remove frequency selective IQ phase mismatch; receive gain compensation block 152 is configured to remove frequency selective IQ gain mismatch; and receive IQ linear combiner 153 is configured to remove any remaining non-frequency selective IQ gain and phase mismatches caused by RX RF front-end 170. The selection of the coefficients for TX inverse IQ balancer and RX IQ balancer 150 is performed through an on-line calibration procedure, as will be described later.

Figure 2:
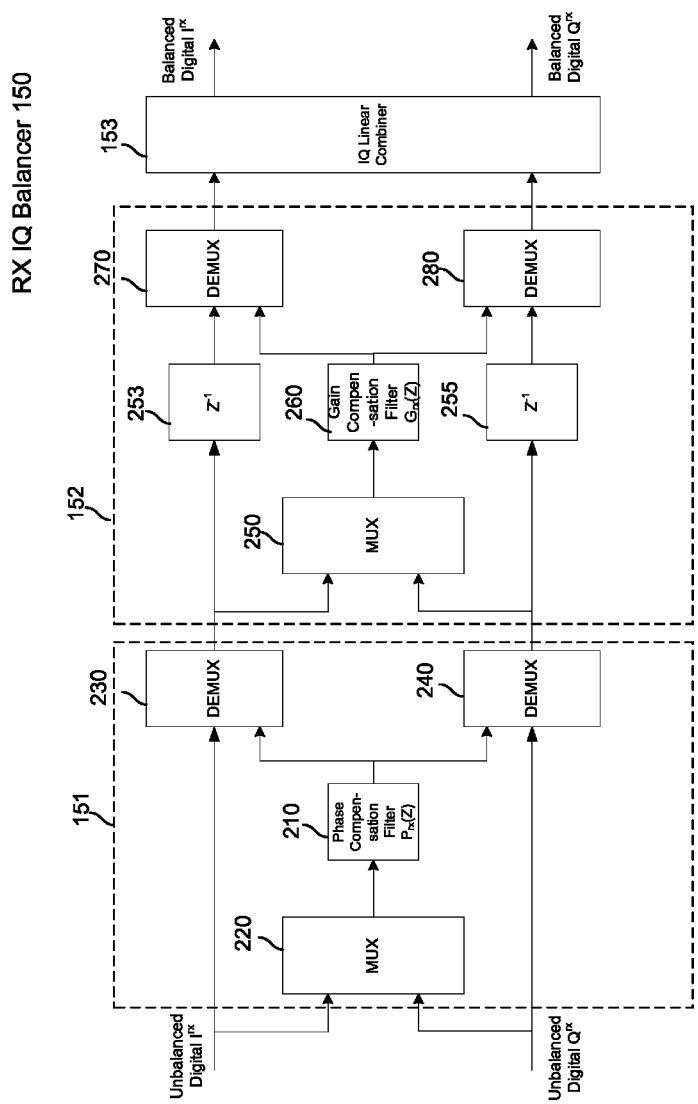
FIG. 2 is a block diagram illustrating an embodiment of an RX IQ balancer 150.

FIG. 2 is a block diagram illustrating an embodiment of RX IQ balancer 150. The frequency selective phase compensation is achieved through the use of a phase compensation filter 210, which is a one-coefficient first order IIR filter denoted by $P_{rx}(Z)$. A multiplexer (MUX) 220 preceding $P_{rx}(Z)$ is used to select either the I or Q signal to pass through filter 210. When the phase imbalance is caused by the I signal preceding the Q signal by more than 90 degrees, the I signal is selected. Conversely, when the phase imbalance is caused by the I signal preceding the Q signal by less than 90 degrees, the Q signal is selected. When I is selected to pass through phase compensation filter 210, a demultiplexer (DEMUX) 230 at the I branch selects the output of phase compensation filter 210, and a demultiplexer (DEMUX) 240 at the Q branch selects the unfiltered, original Q. Similarly, when Q is selected to pass through phase compensation filter 210, DEMUX 230 at the I branch selects the original I and DEMUX 240 at the Q branch selects the output of phase compensation filter 210. The I and Q signals at the output of DEMUX 230 and 240 then pass through multiplexer (MUX) 250, demultiplexers 270 and 280, and a gain compensation filter 260, denoted by $G_{rx}(Z)$, in a manner similar to the previously described phase compensation stage: if gain compensation filter 260 is selected to shape the I signal, then MUX 250 selects the I signal. Similarly, if the gain compensation filter 260 is selected to shape the Q signal, then MUX 250 selects the Q signal. It should be noted that delay units ($Z^{-1}$) 253 and 255 are placed in the I and Q paths, respectively, in order to compensate for the filter delay caused by gain compensation filter 260 and align the signals that do not pass through gain compensation filter with the signal that does. Finally, the receive IQ linear combiner 153 is used to combine the I and Q signals to form the final desirable balanced digital IQ. In an alternative embodiment, the order of receive gain compensation block 152 and receive phase compensation block 151 are switched, with block 152 preceding block 151.

Figure 3:
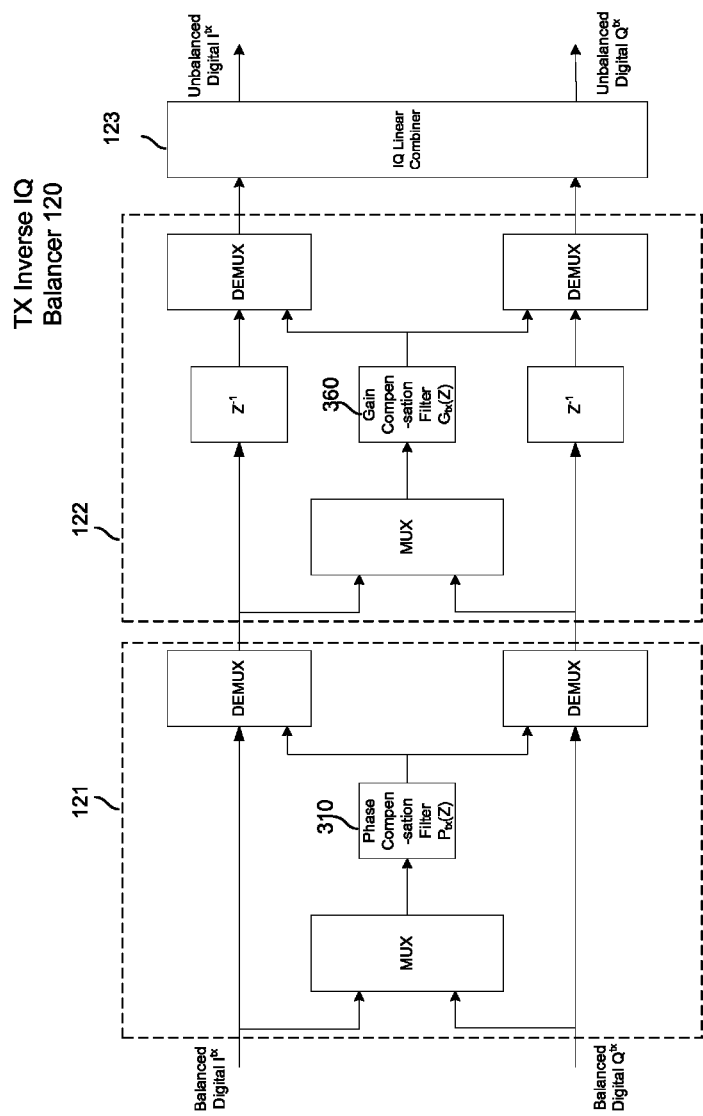
FIG. 3 is a block diagram illustrating an embodiment of a TX inverse IQ balancer 120.

FIG. 3 is a block diagram illustrating an embodiment of the TX inverse IQ balancer 120. The TX inverse IQ balancer signal processing is identical to that of RX IQ balancer 150; only the coefficients for the phase compensation filter, gain compensation filter and IQ linear combiner are selected differently for the TX and RX chains.

Figure 4:
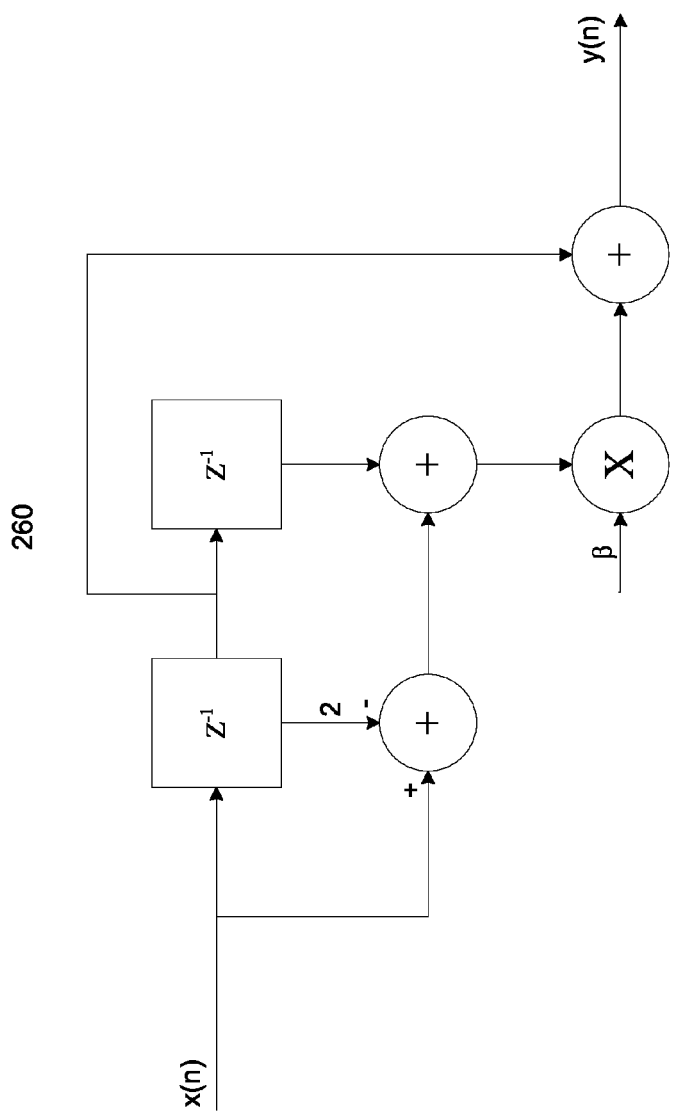
FIG. 4 is a block diagram illustrating an embodiment of a receive gain compensation filter 260, implemented as a one-coefficient, second order finite impulse response (FIR) filter.

FIG. 4 is a block diagram illustrating an embodiment of the receive gain compensation filter 260. The frequency selective gain compensation is achieved through the use of receive gain compensation filter 260, which is a one-coefficient, second order finite impulse response (FIR) filter. The selection of coefficient β will be described later.

Figure 5:
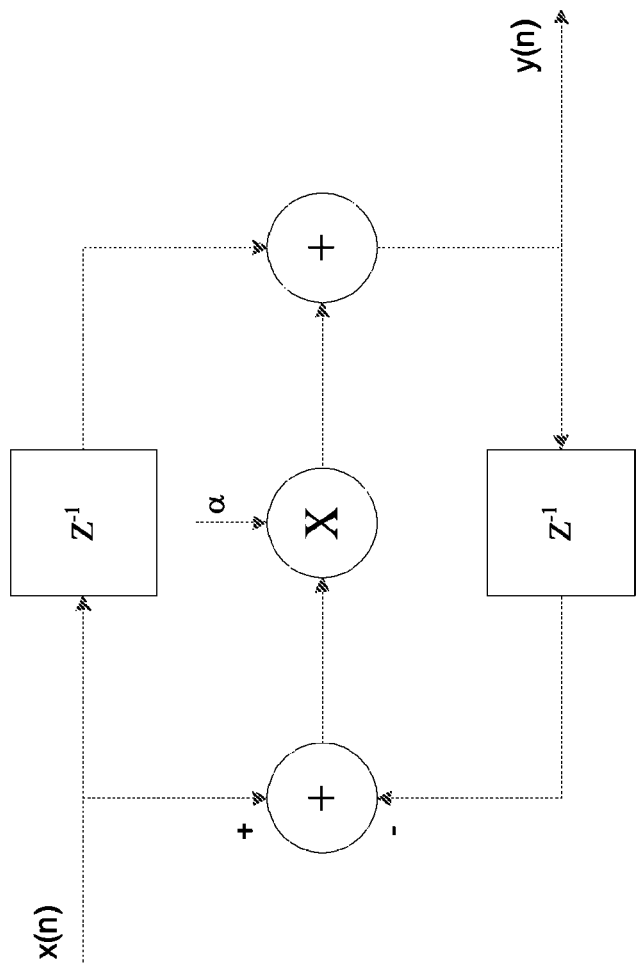
FIG. 5 is a block diagram illustrating an embodiment of a receive phase compensation filter 210, implemented as a one-coefficient, first order infinite impulse response (IIR) filter.

FIG. 5 is a block diagram illustrating an embodiment of receive phase compensation filter 210. The frequency selective phase compensation is achieved through the use of receive compensation filter 210, which is a one-coefficient, first order infinite impulse response (IIR) filter. The selection of coefficient a will be described later.

Figure 6:
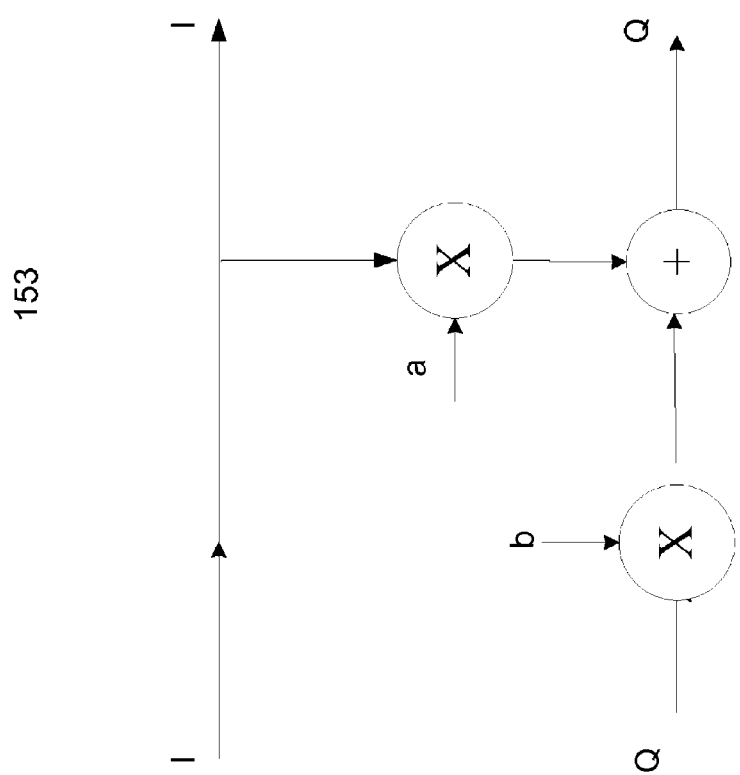
FIG. 6 is a block diagram illustrating an embodiment of a receive IQ linear combiner 153.

FIG. 6 is a block diagram illustrating an embodiment of receive IQ linear combiner 153. The non-frequency selective IQ gain and phase compensation is achieved through the use of receive IQ linear combiner 153, which is a two-coefficient IQ linear combiner. The selection of coefficients a and b will be described later.

With reference to FIG. 3, the implementation of the transmit gain compensation filter 360, transmit phase compensation filter 310, and transmit IQ linear combiner 123 can be implemented in like manner as receive gain compensation filter 260, receive phase compensation filter 210, and receive IQ linear combiner 153, respectively.

Figure 7:
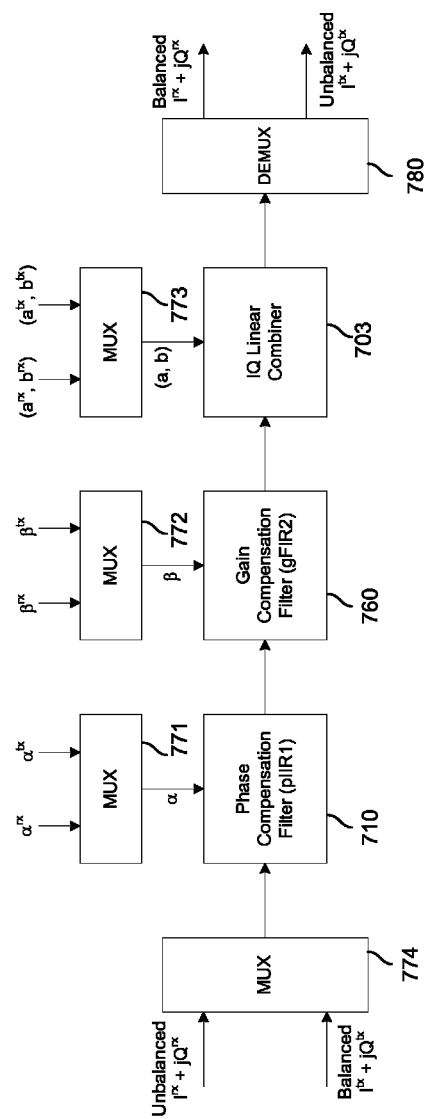
FIG. 7 is a block diagram illustrating an embodiment of a TX inverse IQ balancer 120 and RX IQ balancer 150 circuits, wherein the circuits can be shared when the radio transmitter and receiver are not simultaneously active.

FIG. 7 is a block diagram illustrating an embodiment of the TX inverse IQ balancer 120 and RX IQ balancer 150 circuits, wherein the circuits can be shared when the radio transmitter and receiver are not simultaneously active, i.e., when they are operating in half-duplex mode. By using the exact same architecture for the two balancers, it becomes possible to share the hardware circuit for both: transmit phase compensation filter 310 and receive phase compensation filter 210 can be implemented using a single phase compensation filter circuit 710; transmit gain compensation filter 360 and receive gain compensation filter 260 can be implemented using a single gain compensation filter circuit 760; and transmit IQ linear combiner 123 and receive IQ linear combiner 153 can be implemented using a single IQ linear combiner circuit 703. Multiplexers 771, 772 and 773 are used to select either the transmit or receive coefficients for the phase compensation filter circuit 710, the gain compensation filter circuit 760, and IQ linear combiner circuit 703. A multiplexer 774 is used to select TX or RX as the input, and a demultiplexer 780 is used to select the resulting TX or RX as the output.

Figure 8:
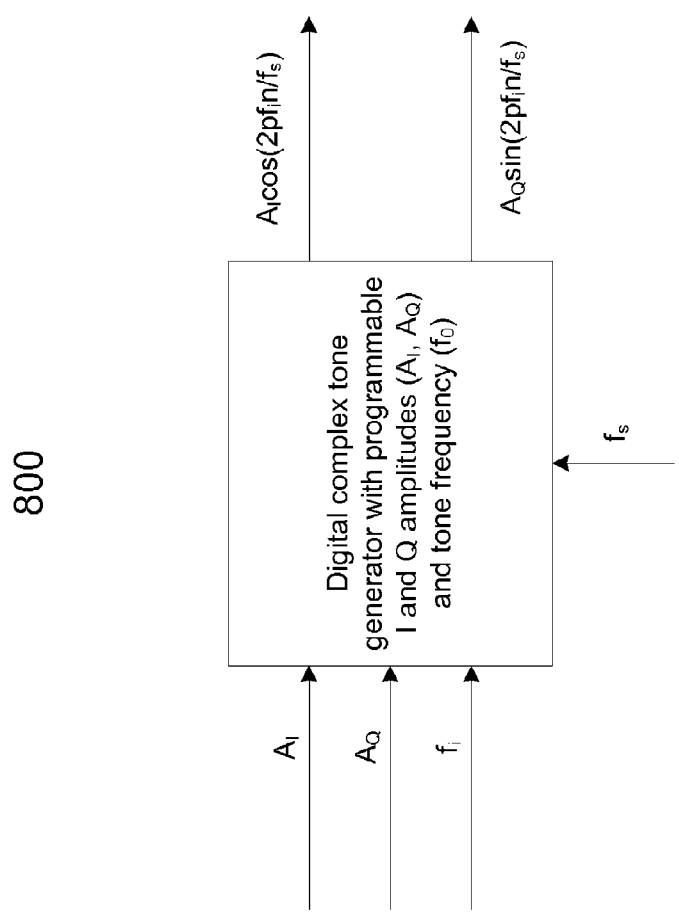
FIG. 8 is a block diagram illustrating an embodiment of a digital tone generator 800.
Figure 9:
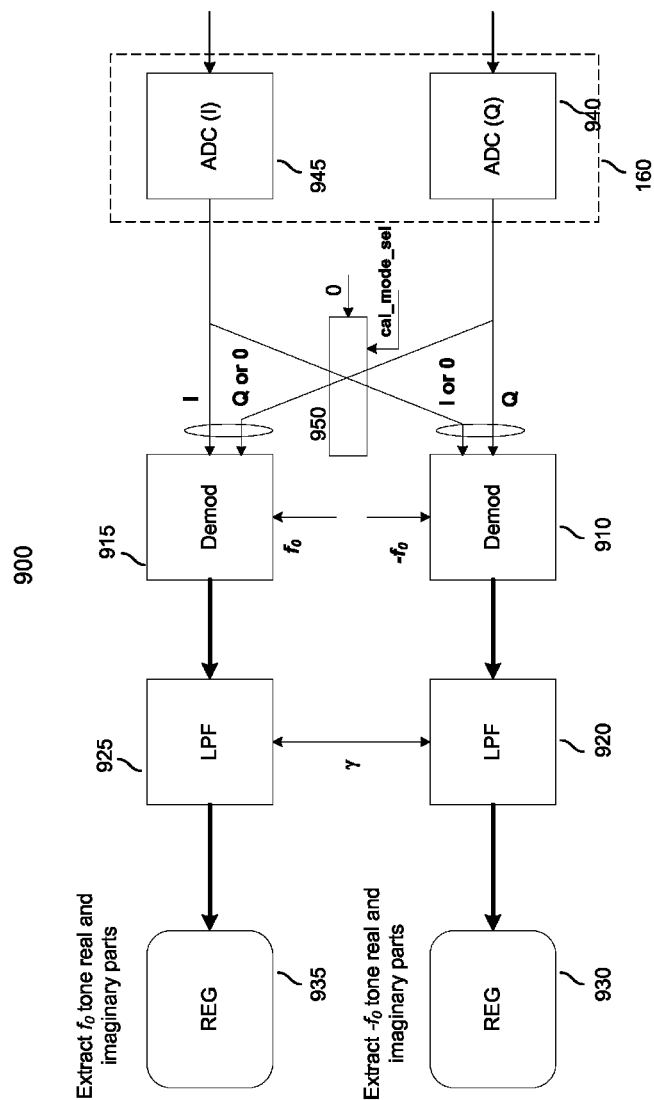
FIG. 9 is a block diagram illustrating an embodiment of a digital tone detector 900, which performs digital tone amplitude and phase detection.
Figure 12:
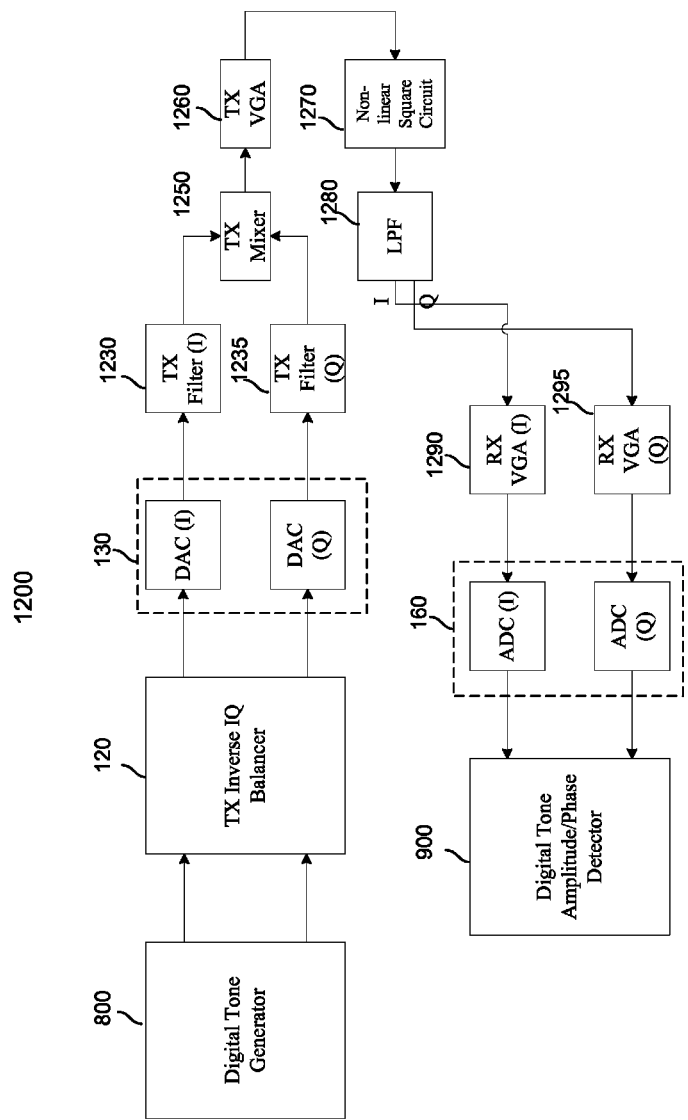
FIG. 12 is a block diagram illustrating an embodiment of a radio circuitry for TX loopback mode operation.
Figure 13:
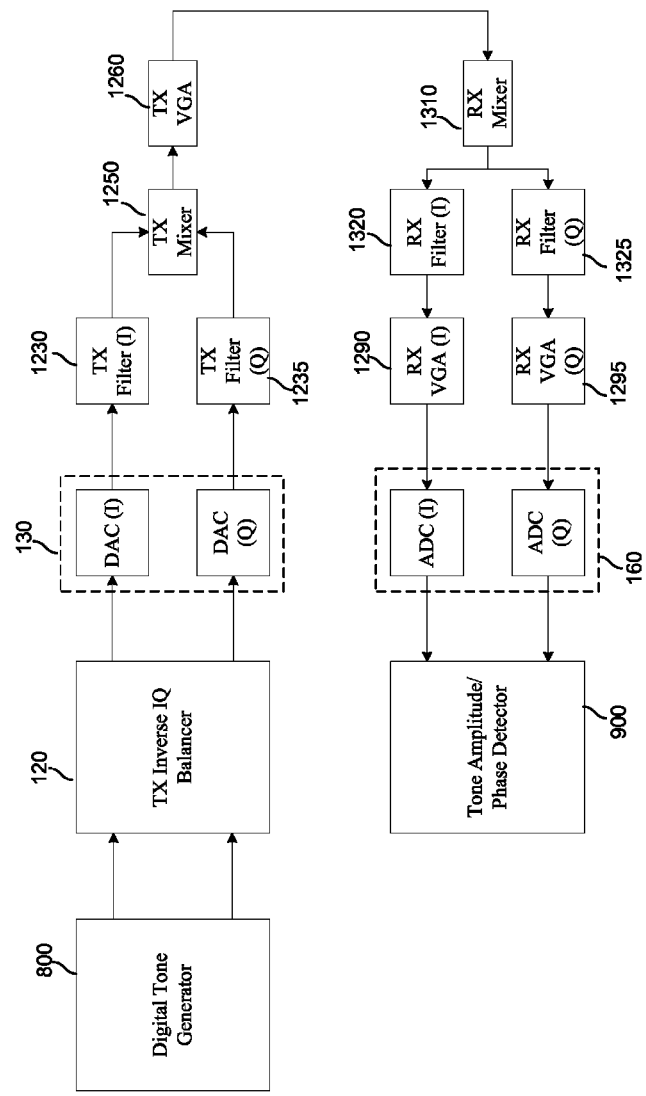
FIG. 13 is a block diagram illustrating an embodiment of a radio circuitry for RX loopback mode operation.

FIG. 8 is a block diagram illustrating an embodiment of a digital tone generator 800. FIG. 9 is a block diagram illustrating an embodiment of a digital tone detector 900, which performs digital tone amplitude and phase detection. Digital tone generator 800 and digital tone detector 900 work together in the digital domain to perform measurements during the calibration procedure to compute the coefficients of TX inverse IQ balancer 120 and RX IQ balancer 150. In particular, digital tone generator 800 emits a digital tone (either complex or real) at the desired I and Q amplitudes and tone frequency, which is passed through TX DAC 130 and TX RF front-end 140. For TX calibration, the TX loopback mode as shown in FIG. 12 is employed to loopback the signal to present at RX ADC. For RX calibration, the RX loopback mode as shown in FIG. 13 is activated to loopback the signal to present at RX ADC. The output of RX ADC 160 is then processed by digital tone (either complex or real) amplitude and phase detector 900 to perform measurements of the RF imbalance amount between the I and Q signals, in order to compute the balancer coefficients.

Figure 10:
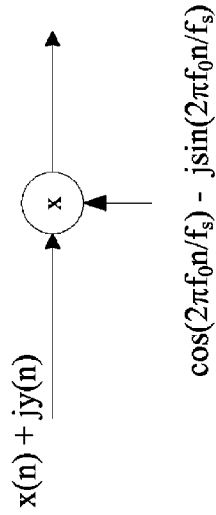
FIG. 10 is a block diagram illustrating an embodiment of a complex demodulator 910 or 915.
Figure 11:
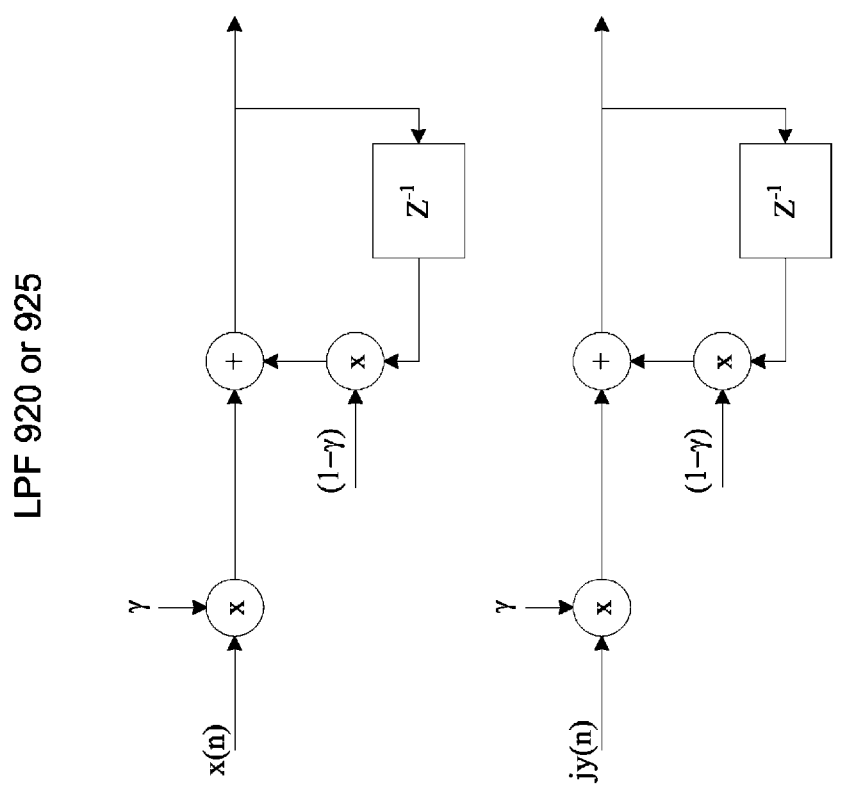
FIG. 11 is a block diagram illustrating an embodiment of a complex LPF 920 or 925.

With reference to FIG. 9, the upper and lower branches of digital tone detector 900 are designed to detect the amplitude and phase at the double sides of a selectable frequency, i.e., $f_0$ and $-f_0$. The circuitry of the upper and lower branches are nearly identical, except that the upper branch is designed to measure the complex tone centered at $f_0$, whereas the lower branch measures the complex tone centered at $-f_0$ (note that $f_0$ can be either positive or negative). After passing through complex demodulator 910 or 915, the desired tone is down shifted to DC. LPF 920 or 925 then extracts the real and imaginary parts of this DC component, effectively measuring the real and imaginary parts of the desired tone. The output of LPF filters 920 and 925 are latched into registers 930 and 935, respectively, which are then read by a host processor to detect the amplitude and phase of the desired tone and to compute the TX inverse IQ balancer coefficients accordingly. A more detailed discussion of this coefficient computation procedure is given later. FIG. 10 is a block diagram illustrating an embodiment of complex demodulator 910 or 915, and FIG. 11 is a block diagram illustrating an embodiment of complex LPF 920 or 925. Demodulator 910 (or 915) is complex in that it performs the $e^{-j2\pi f_0 t}$ operation; LPF 920 (or 925) is also complex in that it performs both the real and imaginary parts filtering. While the embodiments shown in FIGS. 10 and 11 show typical implementations for complex demodulator 910 or 915 and LPF 920 or 925, any other forms that can achieve the same functions can be applied as well.

Additionally, there is additional calibration circuitry in the analog domain which works in conjunction with the two digital blocks (digital tone generator 800 and digital tone detector 900) to complete the calibration loop. FIG. 12 is a block diagram illustrating an embodiment of a radio circuitry for TX loopback mode operation, and FIG. 13 is a block diagram illustrating an embodiment of a radio circuitry for RX loopback mode operation. The RF TX loopback mode shown in FIG. 12 is used for "learning" the TX inverse IQ balancer coefficients, whereas the RX loopback mode shown in FIG. 13 is used for "learning" the RF RX IQ balancer coefficients.

With reference to FIG. 12, the TX loopback mode will be described. Digital tone generator 800 produces a digital tone with a desired amplitude and frequency ($f_i$). This tone is first passed through TX inverse IQ balancer 120 (with proper intermediate coefficients selected, as described later) to produce the desired pre-distorted IQ signal, which is then fed into DAC 130. The resulting analog IQ signal then goes through an in-phase transmit filter 1230 and a quadrature transmit filter 1235 and is up-converted to the RF band by a transmit mixer 1250, and is finally amplified by a TX variable gain amplifier (VGA) 1260. In the normal TX signal chain, this TX VGA RF output would go to the antenna to be transmitted over the air. In the TX loopback mode, however, this RF signal is looped back to the receiver chain by first using a non-linear square circuit 1270 to generate tones that are harmonics of the originally generated tone. Non-linear square circuit 1270 also converts the signal to baseband, such that the tone with frequency $2f_i$ appears at the output and is processed by an analog LPF 1280. The output of analog LPF 1280 is further amplified by RX VGA (I) 1290 and RX VGA (Q) 1295 to provide adequate signal level for ADC 160 to sample and convert to the digital domain. The signal appearing at the output of non-linear square circuit 1270 has a real value, in which case only one signal chain is needed (the I-path) following the output of non-linear square circuit 1270. The output of ADC 160 is then presented to the digital tone amplitude and phase detector 900 for digital signal processing.

FIG. 13 is a block diagram illustrating an embodiment of the RX loopback mode. Digital tone generator 800 produces a digital tone with a desired amplitude and frequency ($f_i$). This tone is first passed through TX inverse IQ balancer 120 (with proper coefficients selected as described later) to produce the desired pre-distorted IQ signal, which is then fed into DAC 130. The resulting analog IQ signal then goes through in-phase transmit filter 1230 and quadrature transmit filter 1235 and is up-converted to the RF band by transmit mixer 1250, and is finally amplified by the TX variable gain amplifier (VGA) 1260. In the normal TX signal chain, this TX VGA RF output would go to the antenna to be transmitted over the air. In the RX loopback mode, however, this RF signal is looped back to the receiver chain through the RX mixer 1310 followed by the normal RX receiving signal chain including RX filtering by RX Filter (I) 1320 and RX Filter (Q) 1325, then signal amplification by RX VGA (I) 1290 and RX VGA (Q) 1295. The IQ signal is then presented to ADC 160 for digitization, finally appearing as the input to digital tone amplitude and phase detector 900 for digital signal processing.

Referring to FIG. 9, only the in-phase output from ADC 160, ADC (I), is valid in the TX loopback mode, and thus only the upper branch is active. Additionally, the cal_mode_sel signal is used to set Q=0 as one of the inputs to demodulator 915 in the upper branch under this mode. Conversely, both the ADC (I) and ADC (Q) outputs are valid in the RX loopback mode, and thus both the upper and lower branches of digital tone detector 900 are active. Accordingly, the cal_mode_sel control signal for switch 950 is set to output the ADC (Q) 940 output to demodulator 915, and the ADC (I) 945 output to demodulator 910. The operation of demodulators 915 and 910 and LPFs 925 and 920 are as previously described, while the desired tone frequency is selected as $f_0=f_i$. The output of LPFs 925 and 920, both including real and imaginary parts, are latched into the registers and then read by a host processor to detect the amplitude and phase for frequencies $f_0$ and $-f_0$. The details of this calibration procedure are described next.

Figure 14:
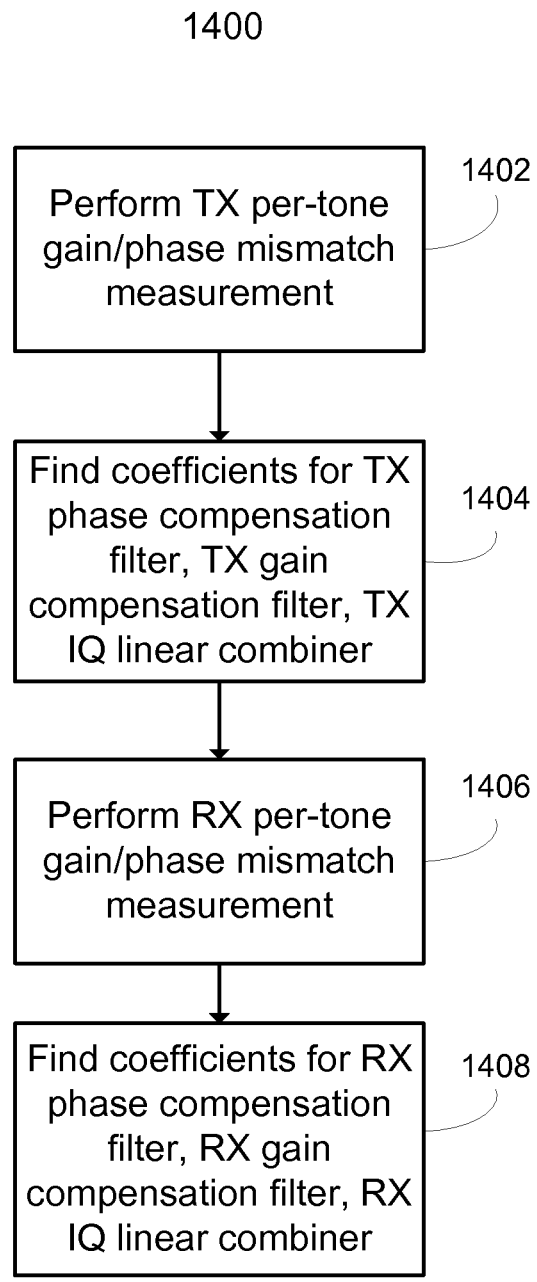
FIG. 14 is a diagram illustrating an embodiment of a process 1400 for calibrating the TX RF front-end frequency selective IQ gain and phase mismatches and the RX RF front-end frequency selective IQ gain and phase mismatches.

FIG. 14 is a diagram illustrating an embodiment of a process 1400 for calibrating the TX RF front-end frequency selective IQ gain and phase mismatches and the RX RF front-end frequency selective IQ gain and phase mismatches. At 1402, TX per-tone gain and phase mismatch measurements are performed. The radio is set to TX loopback mode. Multiple tones are transmitted, and for each tone the gain and phase mismatch at the tone frequency is measured. At 1404, based on the gain and phase mismatch for each tone frequency, a search is performed for the coefficients of transmit phase compensation filter 310, transmit gain compensation filter 360, and transmit IQ linear combiner 123. At 1406, RX per-tone gain and phase mismatch measurements are performed. With the radio set to RX loopback mode, multiple tones are transmitted, and the gain and phase mismatch at each tone frequency is measured. At 1408, a search is performed for the coefficients of the receive phase compensation filter 210, receive gain compensation filter 260, and receive IQ linear combiner 153.

The per-tone TX phase and gain mismatch measurement procedure (step 1402) is now described. For a given frequency, $f_i$, the corresponding TX phase/gain mismatches, denoted as $\Delta\phi_i^{tx}$, $\Delta g_i^{tx}$, are measured with the radio in TX loopback mode, the transmit phase compensation block 121 and transmit gain compensation block 122 of the TX inverse IQ balancer 120 in bypass mode, and the coefficients of TX IQ linear combiner 123 initialized as $a_i^{tx}=0$, $b_i^{tx}=1$. A digital tone with frequency $f_i$ is sent with the in-phase component only, and with the radio in TX loopback mode, the tone magnitude at frequency $2f_i$ is measured by first demodulating the signal at the ADC output to DC and passing it through a lowpass filter. The magnitude of the DC (after demodulation and lowpass filtering), denoted by $A_{dc}^I$, is estimated. The in-phase component gain can be estimated as $g_I=2\sqrt{A_{dc}^I}$. Similarly, a digital tone with frequency $f_i$ is sent with the quadrature-phase component only, and the tone magnitude at $2f_i$ is measured by demodulating the signal at the ADC output to DC and lowpass filtering it. The magnitude of the DC (after demodulation and lowpass filtering), denoted by $A_{dc}^Q$, is estimated. The quadrature-phase component gain can be estimated as $g_Q=2\sqrt{A_{dc}^Q}$. The TX gain mismatch at frequency $f_i$ is computed as $$\Delta g_i^{tx} = \frac{g_I}{g_Q}.$$

To find the TX phase mismatch at frequency $f_i$, the gain mismatch is first compensated for in the TX IQ linear combiner 123 by setting the coefficients $a_i^{tx}=0$, $b_i^{tx}=\Delta g_i^{tx}$. A digital tone at frequency $f_i$ is sent with both in-phase and quadrature components of equal magnitude, and the tone magnitude at $2f_i$ is measured by demodulating the signal at ADC output to DC and passing it through a lowpass filter. The magnitude of the DC (after demodulation and lowpass filtering), denoted by $A_{dc}^{IQ}$, is estimated. The magnitude of the phase mismatch is then given by $$|\Delta\phi_i^{tx}| = \sin^{-1}\frac{2|A_{dc}^{IQ}|}{g_I^2}.$$

While the magnitude of the TX phase mismatch has been estimated, the sign of the TX phase mismatch—positive or negative—remains to be determined. First, assuming that the sign of the TX phase mismatch is positive, the coefficients of TX IQ linear combiner 123 are set to $a_i^{tx}=-\Delta g_i^{tx}\sin(\Delta\phi_i^{tx})$, $b_i^{tx}=\Delta g_i^{tx}\cos(\Delta\phi_i^{tx})$ in order to correct both the gain and phase mismatches. A digital tone at frequency $f_i$ is sent with both in-phase and quadrature components of equal magnitude, and the tone magnitude at $2f_i$ is measured by demodulating the signal at ADC output to DC and passing it through a lowpass filter. The magnitude of the DC (after demodulation and lowpass filtering), denoted by $A_{dc}^{pos}$, is estimated.

Next, assuming that the sign of the TX phase mismatch is negative, the coefficients of TX IQ linear combiner 123 are set to $a_i^{tx}=+\Delta g_i^{tx}\sin(\Delta\phi_i^{tx})$, $b_i^{tx}=\Delta g_i^{tx}\cos(\Delta\phi_i^{tx})$ in order to correct both the gain and phase mismatches. A digital tone at frequency $f_i$ is sent with both in-phase and quadrature components of equal magnitude, and the tone magnitude at $2f_i$ is measured by demodulating the signal at ADC output to DC and passing it through a lowpass filter. The magnitude of the DC (after demodulation and lowpass filtering), denoted by $A_{dc}^{neg}$, is estimated. The TX phase mismatch at frequency $f_i$ is estimated as $\Delta\phi_i^{tx}=|\Delta\phi_i^{tx}|$, if $A_{dc}^{pos}$ is less than $A_{dc}^{neg}$; and as $\Delta\phi_i^{tx}=-|\Delta\phi_i^{tx}|$ otherwise.

The per-tone RX phase and gain mismatch measurement procedure (step 1406) is now described. For a given frequency, $f_i$, the corresponding RX phase/gain mismatches are measured with the radio in RX loopback mode, the TX phase compensation block 121 and TX gain compensation filter block 122 of TX inverse IQ balancer 120 in bypass mode, and the coefficients of TX IQ linear combiner 123 initialized as $a_i^{tx}=-\Delta g_i^{tx}\sin(\Delta\phi_i^{tx})$, $b_i^{tx}=\Delta g_i^{tx}\cos(\Delta\phi_i^{tx})$. A digital tone at frequency $f_i$ is sent with both in-phase and quadrature components of equal magnitude. Referring to FIG. 9, the complex tones at frequencies $-f_i$ and $f_i$ are measured by the two branches of the digital tone detector 900 as previously described. Denote the two outputs latched into registers 930 and 935, corresponding to frequencies $-f_i$ and $f_i$, as $v_i$ and $d_i$, respectively. Let $$K_i = \frac{d_i v_i}{|d_i + v_i^*|^2}$$

Then, the RX gain mismatch is estimated as $$\Delta g_i^{rx} = \sqrt{1-4\text{real}\{K_i\}}$$

and the RX phase mismatch is estimated as $$\Delta\phi_i^{rx} = \sin^{-1}\left(-\frac{2\text{Imag}\{K_i\}}{\Delta g_i^{rx}}\right).$$

By the aforementioned procedure, the TX phase/gain and RX phase/gain mismatches for a given frequency $f_i$, $\Delta\phi_i^{tx}$, $\Delta g_i^{tx}\Delta\phi_i^{rx}$, $\Delta g_i^{rx}$, respectively, are obtained. The same procedure may be repeated for 2N frequency points of interest, denoted by $\{f_i\backslash i=\pm 1, \pm 2, \ldots, \pm N\}$ where $f_{-i}=f_i$, to produce a set of TX phase/gain and RX phase/gain mismatches for 2N frequency points. The frequency points are chosen with sufficient resolution such that the corresponding phase/gain mismatch measurements adequately captures the frequency dependent characteristics of the RF transmitter and receiver chain. The set $\{\Delta\phi_i^{tx}, \Delta g_i^{tx}, \Delta\phi_i^{rx}, \Delta g_i^{rx}, i=\pm 1, \pm 2, \ldots, \pm N\}$ can then be used to calculate the coefficients of TX inverse IQ balancer 120 and RX IQ balancer 150, as described next.

Figure 15:
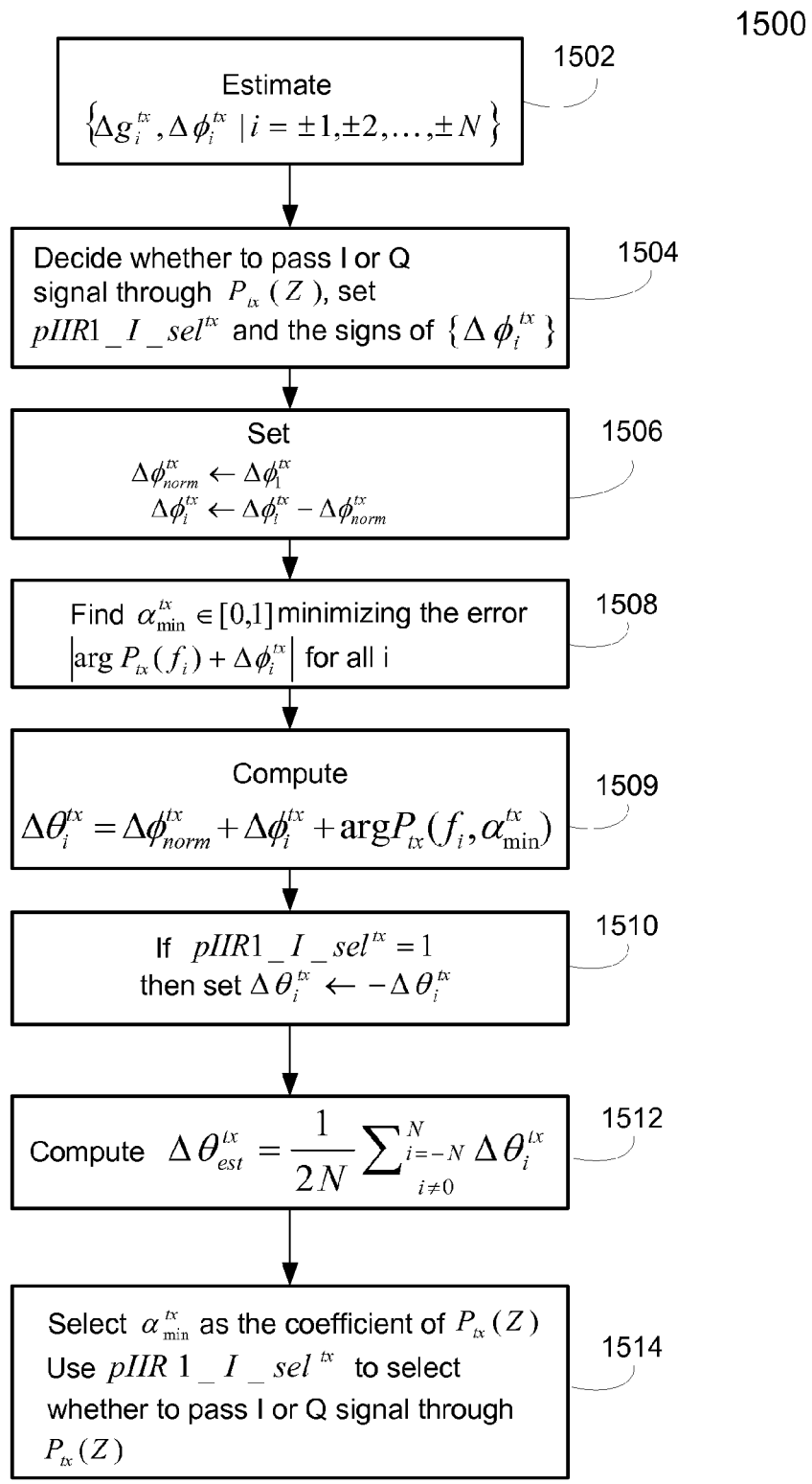
FIG. 15 is a flowchart depicting an embodiment of a search procedure for computing the coefficients of a TX phase compensation block 121.

FIG. 15 is a flowchart depicting an embodiment of a search procedure for computing the coefficients of TX phase compensation block 121. At 1502, the set of TX IQ gain and phase mismatch estimates for all frequencies of interest, $\{g_i^{tx}, \Delta\phi_i^{tx}|i=\pm 1, \pm 2, \ldots, \pm N\}$, are obtained by the per-tone calibration procedure (step 1402) described above. Without loss of generality, the frequencies are ordered $0<f_1<f_2<\ldots<f_N$.

At 1504, it is determined whether to choose the in-phase (I) or the quadrature-phase (Q) signal through the filter $P_{tx}(Z)$ in TX phase compensation block 121. If $\Delta\phi_1^{tx}<\Delta\phi_N^{tx}$, then (i) the I signal is selected to pass through $P_{tx}(Z)$; (ii) the multiplexer control signal pIIR1_I_sel$^{tx}$ is set to 1; and (iii) the signs of all of the phase mismatch estimates are reversed by setting $\Delta\phi_i^{tx}=-\Delta\phi_i^{tx}$. Otherwise, (i) the Q signal is selected to pass through $P_{tx}(Z)$; and (ii) the multiplexer control signal pIIR1_I_sel$^{tx}$ is set to 0.

At 1506; the quantity $\Delta\phi_{norm}^{tx}$ is set to $\Delta\phi_1^{tx}$, and then the phase mismatch estimates are normalized by setting $\Delta\phi_i^{tx}\leftarrow\Delta\phi_i^{tx}-\Delta\phi_{norm}^{tx}$ for all i.

At 1508, a search is performed for the coefficient $\alpha^{tx}\in[0, 1]$ that minimizes the error $|\arg P_{tx}(f_i)+\Delta\phi_i^{tx}|$ for all i, where arg $P_{tx}(f_i)$ denotes the angle of $P_{tx}(Z)$ evaluated at frequency point $f_i$. The error minimization may be performed using a least squares criterion or a minimax criterion; other criteria are also possible. For example, if least squares error minimization is performed, the coefficient $\alpha^{tx}\in[0, 1]$ minimizing the error function $$\sum_i |\arg P_{tx}(f_i) + \Delta\phi_i^{tx}|^2$$

is chosen. The solution for this search is denoted by $\alpha_{min}^{tx}$.

At 1509, the transmit phase mismatch at frequency point $f_i$ is computed as $\Delta\theta_i^{tx}=\Delta\phi_{norm}^{tx}+\arg P_{tx}(f_i, \alpha_{min}^{tx})$, where $\arg P_{tx}(f_i, \alpha_{min}^{tx})$ is the angle of $P_{tx}(Z)$ evaluated at frequency point $f_i$ with TX phase compensation filter coefficient $\alpha_{min}^{tx}$.

At 1510, if pIIR1_I_sel$^{tx}$=1, then the signs of the phases mismatch estimates are reversed by setting $\Delta\theta_i^{tx}=-\Delta\theta^{tx}$.

At 1512, the quantity $\Delta\theta_{est}^{tx}$ is computed as $$\Delta\theta_{est}^{tx} = \frac{1}{2N}\sum_{\substack{i=-N \\ i\neq 0}}^{N} \Delta\theta_i^{tx}. \quad \Delta\theta_{est}^{tx}$$

is used to compute the coefficients of TX IQ linear combiner 123, as will be described later.

At 1514, the coefficient of $P_{tx}(Z)$ is selected to be $\alpha_{min}^{tx}$. The multiplexer control signal pIIR1_I_sel$^{tx}$ resulting from step 1504 is used to select whether the I or Q signal passes through $P_{tx}(Z)$ in transmit phase compensation block 121.

Figure 16:
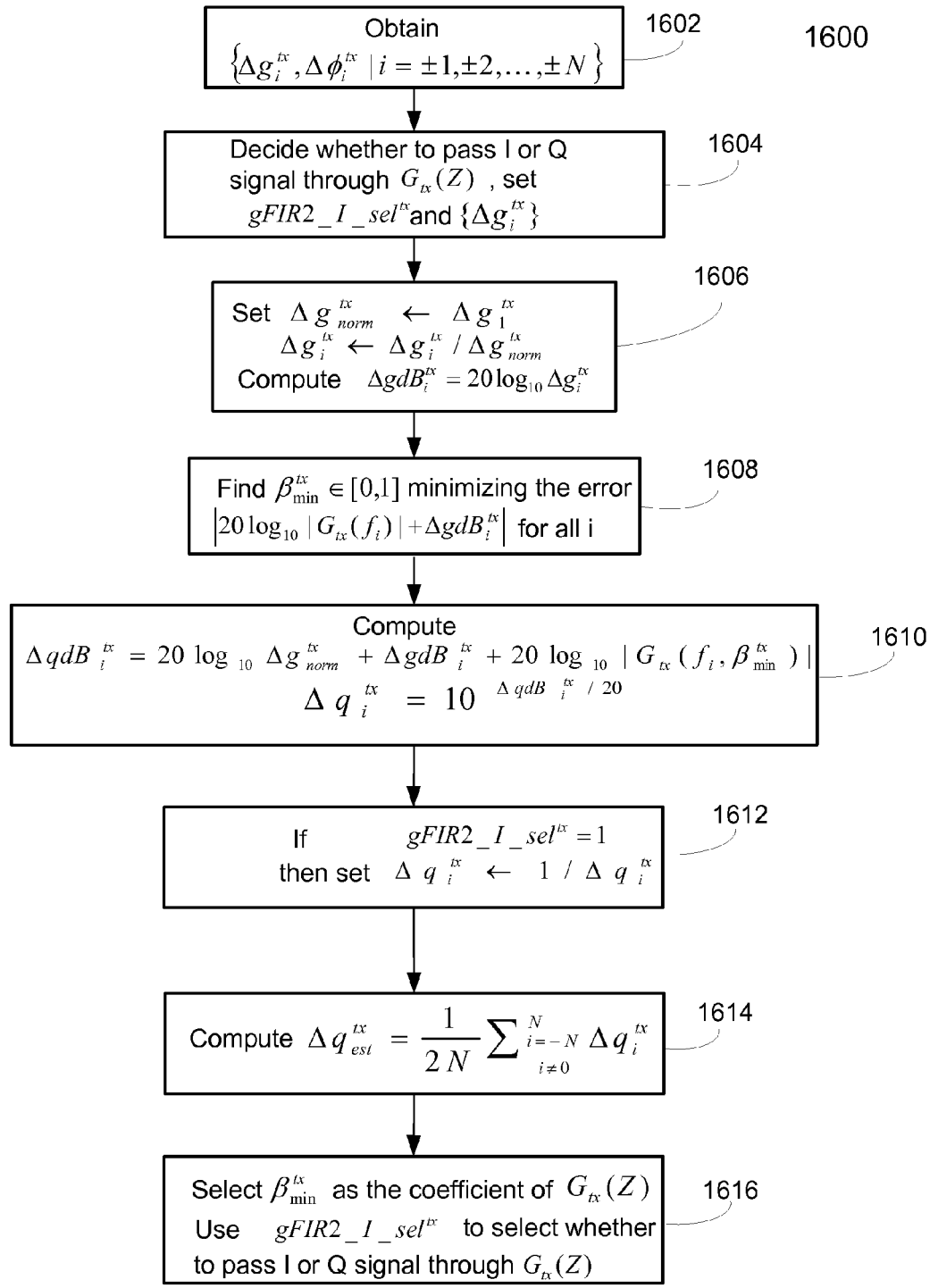
FIG. 16 is a flowchart depicting an embodiment of a search procedure for computing the coefficients of a TX gain compensation block 122.

FIG. 16 is a flowchart depicting an embodiment of a search procedure for computing the coefficients of TX gain compensation block 122. At 1602, the set of TX IQ gain and phase mismatch estimates for all frequencies of interest, $\{\Delta g_i^{tx}, \Delta\phi_i^{tx}|i=\pm 1, \pm 2, \ldots, \pm N\}$, are readily available from step 1502 of the search procedure for computing the coefficients of TX phase compensation block 121 as described above. Without loss of generality, the frequencies are ordered $0<f_1<f_2< \ldots <F_N$.

At 1604, it is determined whether to choose the in-phase (I) or the quadrature-phase (Q) signal through the filter $G_{tx}(Z)$ in TX gain compensation block 122. If $\Delta g_1^{tx}<\Delta g_N^{tx}$, then (i) the I signal is selected to pass through $G_{tx}(Z)$; (ii) the multiplexer control signal gFIR3_I_sel$^{tx}$ is set to 1; and (iii) all of the gain mismatch estimates are inverted by setting $\Delta g_i^{tx}=1/\Delta g_i^{tx}$. Otherwise, (i) the Q signal is selected to pass through $G_{tx}(Z)$; and (ii) the multiplexer control signal gFIR2_I_sel$^{tx}$ is set to 0.

At 1606, the quantity $\Delta g_{norm}^{tx}$ is set to $\Delta g_1^{tx}$, the gain mismatch estimates are normalized by setting $\Delta g_i^{tx} \leftarrow \Delta g_i^{tx}/\Delta g_{norm}^{tx}$ for all i, and the logarithmic gain mismatch estimates are computed as $\Delta g dB_i^{tx}=20 \log_{10}\Delta g_i^{tx}$ for all i.

At 1608, a search is performed for the coefficient $\beta^{tx}\in[0,1]$ that minimizes the error $|20 \log_{10}|G_{tx}(f_i)|\Delta g dB_i^{tx}|$ for all i, where $G_{tx}(f_i)$ denotes $G_{tx}(Z)$ evaluated at frequency point $f_i$. The error minimization may be performed using a least squares criterion or a minimax criterion; other criteria are also possible. For example, if least squares error minimization is performed, the coefficient $\beta^{tx}\in[0,1]$ minimizing the error function $$\sum_i |20\log_{10}|G_{tx}(f_i)|+\Delta g dB_i^{tx}|^2$$

is chosen. The solution for this search is denoted by $\beta_{min}^{tx}$.

At 1610, the logarithmic gain mismatch estimates $\Delta g dB_i^{tx}$ are normalized by computing $\Delta q dB_i^{tx}=20 \log_{10} \Delta g_{norm}^{tx}+\Delta g dB_i^{tx}+20 \log_{10}|G_{tx}(f_i, \beta_{min}^{tx})|$. The normalized gain mismatch estimates are then given by $\Delta q_i^{tx}=10^{\Delta q dB_i^{tx}/20}$ for all i.

At 1612, if gFIR2_I_sel$^{tx}$=1, then the gain mismatch estimates are inverted by setting $\Delta q_i^{tx} \leftarrow 1/\Delta q_i^{tx}$.

At 1614, the quantity $\Delta q_{est}^{tx}$ is computed as $$\Delta q_{est}^{tx} = \frac{1}{2N}\sum_{\substack{i=-N \\ i\neq 0}}^{N} \Delta q_i^{tx}. \quad \Delta q_{est}^{tx}$$

is used to compute the coefficients of the TX IQ linear combiner 123, as will be described later.

At 1616, the coefficient of $G_{tx}(Z)$ is selected to be $\beta_{min}^{tx}$. The multiplexer control signal gFIR2_I_sel$^{tx}$ resulting from step 1604 is used to select whether the I or Q signal passes through $G_{tx}(Z)$ in the transmit gain compensation block 122.

The calculation of the TX inverse IQ balancer linear combiner 123 coefficients, $a^{tx}$ and $b^{tx}$, are computed as $a^{tx}=-\Delta q_{est}^{tx} \sin(\Delta\theta_{est}^{tx})$, $b^{tx}=\Delta q_{est}^{tx}\cos(\Delta\theta_{est}^{tx})$, where $\Delta\theta_{est}^{tx}$ and $\Delta q_{est}^{tx}$ are outputs from the TX phase compensation and gain compensation filter searches, respectively.

The determination of the coefficients of RX IQ balancer 150 can be done in the same manner as previously described for determining the coefficients of the TX inverse IQ balancer. For example, to determine the coefficients of the RX phase compensation block 151, the set of RX IQ gain and phase mismatch estimates for all frequencies of interest, $\{\Delta g_i^{rx}, \Delta\phi_i^{rx}|i=\pm 1, \pm 2, \ldots, \pm N\}$, are obtained by the per-tone calibration procedure described above, where without loss of generality, the frequencies are ordered $0<f_1<f_2<\ldots<f_N$. With the RX calibration results $\{\Delta g_i^{rx}, \Delta\phi_i^{rx}|i=\pm 1, \pm 2, \ldots, \pm N\}$ serving as the input, the procedure described for the $P_{rx}(Z)$ coefficients search may be utilized to find the coefficients of $P_{rx}(Z)$, where the RX results may be similarly denoted by pIIR1_I_sel$^{rx}$, $\alpha_{min}^{rx}$, and $\Delta\theta_{est}^{rx}$.

To determine the coefficients of the RX gain compensation block 152, the set of RX IQ gain and phase mismatch estimates for all frequencies of interest, $\{\Delta g_i^{rx}, \Delta\phi_i^{rx}|i=\pm 1, \pm 2, \ldots, \pm N\}$, have already been computed during the above $P_{rx}(Z)$ coefficients search procedure. Without loss of generality, the frequencies are ordered $0<f_1<f_2<\ldots<f_N$. With the RX calibration results $\{\Delta g_i^{rx}, \Delta\phi_i^{rx}|i=\pm 1, \pm 2, \ldots \pm N\}$ serving as the input, the procedure described for the $G_{rx}(Z)$ coefficients search may be utilized to find the coefficients of $G_{rx}(Z)$, where the RX results may be similarly denoted by gFIR2_I_sel$^{rx}$, $\beta_{min}^{rx}$, and $\Delta q_{est}^{rx}$.

Lastly, the calculation of the RX IQ balancer linear combiner 153 coefficients, $a^{rx}$ and $b^{rx}$, are computed as $$a^{rx} = \tan\Delta\theta_{est}^{rx}, \quad b^{rx} = \frac{1}{\Delta q_{est}^{rx}\cos\Delta\theta_{est}^{rx}},$$

where $\Delta\theta_{est}^{rx}$ and $\Delta q_{est}^{rx}$ are outputs from the RX phase compensation and gain compensation filter searches, respectively.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for reducing a mismatch between an in-phase (I) signal and a quadrature phase (Q) signal, comprising:
   a phase compensation block comprising a one-coefficient infinite impulse response (IIR) filter configured to reduce a first portion of a mismatch between an I signal and a Q signal, wherein the first portion includes frequency selective phase mismatch; and a gain compensation block comprising a one-coefficient finite impulse response (FIR) filter configured to reduce a second portion of the mismatch, wherein the second portion includes frequency selective gain mismatch, the phase compensation block and the gain compensation block connected in an interchangeable cascaded order; and a linear combiner connected to an output of the cascaded phase compensation block and gain compensation block, the linear combiner configured to reduce a third portion of the mismatch;

wherein the phase compensation block and the gain compensation block are calibrated at least in part based on a loopback signal, wherein the loopback signal is routed from a transmitting portion of a radio frequency (RF) circuitry back to a receiving portion of the RF circuitry; and the third portion includes non-frequency selective phase mismatch and non-frequency selective gain mismatch, wherein
the linear combiner is calibrated at least in part based on the loopback signal,
the phase compensation block and the gain compensation block are each configured to operate as either a portion of a transmitter or a portion of a receiver, and
a single hardware circuitry corresponding to the phase compensation block and the gain compensation block is configured to operate as either the portion of the transmitter or the portion of the receiver at least in part by configuring coefficients of the IIR filter and the FIR filter, wherein the transmitter and the receiver are not active at the same time.

2. The system of claim 1, wherein the IIR filter comprises a one-coefficient first order IIR filter.

3. The system of claim 1, wherein the FIR filter comprises a one-coefficient second order FIR filter.

4. The system of claim 1, wherein the calibration of the phase compensation block and the gain compensation block configured to operate as the portion of the transmitter is performed prior to the calibration of the phase compensation block and the gain compensation block configured to operate as the portion of the receiver.

5. The system of claim 1, wherein the calibration of the phase compensation block and the gain compensation block that are configured to operate as the portion of the receiver is at least in part based on the calibration of the phase compensation block and the gain compensation block that are configured to operate as the portion of the transmitter.

6. The system of claim 1, wherein in the event that the phase compensation block and the gain compensation block are configured to operate as the portion of the transmitter, the calibration of the phase compensation block and the gain compensation block based on the loopback signal comprises:
sending a plurality of tones at a plurality of frequencies;
routing the plurality of tones from the transmitting portion of the RF circuitry back to the receiving portion of the RF circuitry as the loopback signal;
detecting a gain mismatch and a phase mismatch corresponding to each of the plurality of tones; and
determining coefficients of the IIR filter and the FIR filter at least in part based on the detected gain mismatch and phase mismatch corresponding to each of the plurality of tones.

7. The system of claim 6, wherein detecting the gain mismatch corresponding to each of the plurality of tones comprises:
sending the tone by sending an I component of the tone and a Q component of the tone separately,
detecting a magnitude corresponding to the I component of the tone at a multiple of the tone frequency;
detecting a magnitude corresponding to the Q component of the tone at the multiple of the tone frequency;
detecting an I component gain at least in part based on the detected magnitude corresponding to the I component of the tone at the multiple of the tone frequency;
detecting a Q component gain at least in part based on the detected magnitude corresponding to the Q component of the tone at the multiple of the tone frequency; and
detecting the gain mismatch corresponding to the tone at least in part based on a ratio of the detected I component gain and the detected Q component gain.

8. The system of claim 6, wherein detecting the phase mismatch corresponding to each of the plurality of tones comprises:
sending the tone by sending an I component of the tone and a Q component of the tone simultaneously;
reducing a gain mismatch between the I component of the tone and the Q component of the tone;
detecting a magnitude corresponding to the tone at a multiple of the tone frequency; and
detecting the phase mismatch corresponding to the tone at least in part based on the detected magnitude and a gain corresponding to the tone.

9. The system of claim 6, wherein determining a coefficient of the IIR filter comprises:
minimizing an aggregate error based on a predetermined criterion, wherein the aggregate error is a function of a plurality of errors, and wherein each of the errors is a sum of an angle of a frequency response of the IIR filter evaluated at one of the plurality of tone frequencies and the phase mismatch corresponding to the tone.

10. The system of claim 9, wherein the predetermined criterion comprises one of the following: a least squares criterion and a minimax criterion.

11. The system of claim 6, wherein determining a coefficient of the FIR filter comprises:
minimizing an aggregate error based on a predetermined criterion, wherein the aggregate error is a function of a plurality of errors, and wherein each of the errors is a sum of a logarithm of a frequency response of the FIR filter evaluated at one of the plurality of tone frequencies and a logarithm of the gain mismatch corresponding to the tone.

12. The system of claim 11, wherein the predetermined criterion comprises one of the following: a least squares criterion and a minimax criterion.

13. The system of claim 1, wherein in the event that the phase compensation block and the gain compensation block are configured to operate as the portion of the receiver, the calibration of the phase compensation block and the gain compensation block based on the loopback signal comprises:
sending a plurality of tones at a plurality of frequencies;
reducing an IQ mismatch corresponding to each tone introduced by the transmitting portion of the RF circuitry by pre-distorting each tone digitally;
routing the plurality of tones from the transmitting portion of the RF circuitry back to the receiving portion of the RF circuitry as the loopback signal;
detecting a gain mismatch and a phase mismatch corresponding to each of the plurality of tones; and determining coefficients of the IIR filter and the FIR filter at least in part based on the detected gain mismatch and phase mismatch corresponding to each of the plurality of tones.

14. The system of claim 13, wherein determining a coefficient of the IIR filter comprises:
minimizing an aggregate error based on a predetermined criterion, wherein the aggregate error is a function of a plurality of errors, and wherein each of the errors is a sum of an angle of a frequency response of the IIR filter evaluated at one of the plurality of tone frequencies and the phase mismatch corresponding to the tone.

15. The system of claim 14, wherein the predetermined criterion comprises one of the following: a least squares criterion and a minimax criterion.

16. The system of claim 13, wherein determining a coefficient of the FIR filter comprises:
minimizing an aggregate error based on a predetermined criterion, wherein the aggregate error is a function of a plurality of errors, wherein each of the errors is a sum of a logarithm of a frequency response of the FIR filter evaluated at one of the plurality of tone frequencies and a logarithm of the gain mismatch corresponding to the tone.

17. The system of claim 16, wherein the predetermined criterion comprises one of the following: a least squares criterion and a minimax criterion.

18. The system of claim 1, wherein the linear combiner is configured to operate as either a portion of a transmitter or a portion of a receiver.

19. The system of claim 18, wherein the calibration of the linear combiner configured to operate as the portion of the transmitter is performed prior to the calibration of the linear combiner configured to operate as the portion of the receiver.

20. The system of claim 18, wherein a single hardware circuitry corresponding to the linear combiner is configured to operate as either the portion of the transmitter or the portion of the receiver at least in part by configuring coefficients of the linear combiner, wherein the transmitter and the receiver are not active at the same time.

21. The system of claim 18, wherein in the event that the linear combiner is configured to operate as the portion of the transmitter, the calibration of the linear combiner based on the loopback signal comprises:
sending a plurality of tones at a plurality of frequencies;
routing the plurality of tones from the transmitting portion of the RF circuitry back to the receiving portion of the RF circuitry as the loopback signal;
detecting a gain mismatch and a phase mismatch corresponding to each of the plurality of tones; and
determining coefficients of the linear combiner at least in part based on the detected gain mismatch and phase mismatch corresponding to each of the plurality of tones.

22. The system of claim 18, wherein in the event that the linear combiner is configured to operate as the portion of the receiver, the calibration of the linear combiner based on the loopback signal comprises:
sending a plurality tones at a plurality of frequencies;
reducing an IQ mismatch corresponding to each tone introduced by the transmitting portion of the RF circuitry by pre-distorting each tone digitally;
routing the plurality of tones from the transmitting portion of the RF circuitry back to the receiving portion of the RF circuitry as the loopback signal;
detecting a gain mismatch and a phase mismatch corresponding to each of the plurality of tones; and
determining coefficients of the linear combiner at least in part based on the detected gain mismatch and phase mismatch corresponding to each of the plurality of tones.

23. The system of claim 1, wherein the linear combiner comprises a two-coefficient linear combiner.

24. The system of claim 23, wherein the phase compensation block, the gain compensation block, and the linear combiner comprise a total of four coefficients.

25. The system of claim 2, wherein the first order IIR filter has an all-pass characteristic and its transfer function is given by:

$$H_{IIR}(z) = \frac{z^{-1} + \alpha}{1 + \alpha z^{-1}}$$

and wherein any IIR filter is applicable to implement the phase compensation block provided that the all-pass characteristic is maintained and the filter coefficients are searched to minimize the difference between the filter phase response and the per-tone phase mismatches measured over the selected frequency points, where $z^{-1}$ is a delay unit and $\alpha$ is a coefficient of the IIR filter.

26. The system of claim 3, wherein the second order filter of linear phase characteristic and its transfer function is given by:

$$H_{FIR}(z) = \beta + (1 - 2\beta)z^{-1} + \beta z^{-2}$$

and wherein any FIR filter is applicable to implement the gain compensation block provided that the linear phase characteristic is maintained and the filter coefficients are searched to minimize the difference between the filter gain response and the per-tone gain mismatches measured over the selected frequency points, where $z^{-1}$ and $z^{-2}$ are delay units and $\beta$ is a coefficient of the FIR filter.

27. The system of claim 18, wherein the calibration of the linear combiner configured to operate as the portion of the transmitter is performed after the calibration of the phase compensation block and the gain compensation block configured to operate as the portion of the transmitter, and wherein the calibration of the linear combiner configured to operate as the portion of the receiver is performed after the calibration of the phase compensation block and the gain compensation block configured to operate as the portion of the receiver.

28. The system of claim 21, wherein in the event that the linear combiner is configured to operate as the portion of the transmitter, the calibration of the linear combiner is based on computing its coefficients $a^{tx}$ and $b^{tx}$ as $a^{tx} = -\Delta q_{est}^{tx} \sin(\Delta \theta_{est}^{tx})$ or, $a^{tx} = +\Delta q_{est}^{tx} \sin(\Delta \theta_{est}^{tx})$ $b^{tx} = \Delta q_{est}^{tx} \cos(\Delta \theta_{est}^{tx})$, where $\Delta \theta_{est}^{tx}$ and $\Delta q_{est}^{tx}$ are outputs from the TX phase compensation and gain compensation filter searches.

29. The system of claim 22, wherein in the event that the linear combiner is configured to operate as the portion of the receiver, the calibration of the linear combiner is based on computing its coefficients $a^{rx}$ and $b^{rx}$ as:

$$a^{rx} = \tan \Delta \theta_{est}^{rx}, \; b^{rx} = 1/\Delta q_{esr}^{rx} \cos \Delta \theta_{est}^{rx}$$

where $\Delta \theta_{est}^{rx}$ and $\Delta q_{est}^{rx}$ are outputs from the RX phase compensation and gain compensation filter searches.

30. The system of claim 1, wherein the third portion of the mismatch comprises residual phase and gain mismatches and the linear combiner is configured to use linear combiner coefficients to suppress the residual phase and gain mismatches averaged over a plurality of frequency bands.

31. The system of claim 30, wherein the linear combiner is configured to eliminate a mean of the residual phase and gain mismatches.

32. The system of claim 30, wherein the FIR filter is a linear phase FIR filter and the residual phase and gain mismatches are calibrated using the linear combiner.

33. The system of claim 1, wherein the phase compensation block comprises only one IIR filter, the gain compensation block comprises only one FIR filter, and only one linear combiner is connected to the output of the cascaded phase compensation block and gain compensation block.

34. A method for reducing a mismatch between an in-phase (I) signal and a quadrature phase (Q) signal, comprising:
   reducing a first portion of a mismatch between an I signal and a Q signal using a phase compensation block, wherein the phase compensation block comprises an infinite impulse response (IIR) filter, and wherein the first portion includes frequency selective phase mismatch;
   reducing a second portion of the mismatch using a gain compensation block, wherein the gain compensation block comprises a finite impulse response (FIR) filter, and wherein the second portion includes frequency selective gain mismatch, the phase compensation block and the gain compensation block connected in an interchangeable cascaded order;
   calibrating the phase compensation block and the gain compensation block at least in part based on a loopback signal, wherein the loopback signal is routed from a transmitting portion of a radio frequency (RF) circuitry back to a receiving portion of the RF circuitry; and
   reducing a third portion of the mismatch using a linear combiner connected to an output of the cascaded phase compensation block and gain compensation block, wherein the third portion includes non-frequency selective phase mismatch and non-frequency selective gain mismatch, wherein the linear combiner is calibrated at least in part based on the loopback signal, the phase compensation block and the gain compensation block are each configured to operate as either a portion of a transmitter or a portion of a receiver, and a single hardware circuitry corresponding to the phase compensation block and the gain compensation block is configured to operate as either the portion of the transmitter or the portion of the receiver at least in part by configuring coefficients of the IIR filter and the FIR filter, wherein the transmitter and the receiver are not active at the same time.

35. A computer program product for reducing a mismatch between an in-phase (I) signal and a quadrature phase (Q) signal, the computer program product being embodied in a non-transitory computer readable storage medium and comprising computer instructions for:
   reducing a first portion of a mismatch between an I signal and a Q signal using a phase compensation block, wherein the phase compensation block comprises an infinite impulse response (IIR) filter, and wherein the first portion includes frequency selective phase mismatch;
   reducing a second portion of the mismatch using a gain compensation block, wherein the gain compensation block comprises a finite impulse response (FIR) filter, and wherein the second portion includes frequency selective gain mismatch, the phase compensation block and the gain compensation block connected in an interchangeable cascaded order; and
   calibrating the phase compensation block and the gain compensation block at least in part based on a loopback signal, wherein the loopback signal is routed from a transmitting portion of a radio frequency (RF) circuitry back to a receiving portion of the RF circuitry; and
   reducing a third portion of the mismatch using a linear combiner connected to an output of the cascaded phase compensation block and gain compensation block, wherein the third portion includes non-frequency selective phase mismatch and non-frequency selective gain mismatch, wherein the linear combiner is calibrated at least in part based on the loopback signal, the phase compensation block and the gain compensation block are each configured to operate as either a portion of a transmitter or a portion of a receiver, and a single hardware circuitry corresponding to the phase compensation block and the gain compensation block is configured to operate as either the portion of the transmitter or the portion of the receiver at least in part by configuring coefficients of the IIR filter and the FIR filter, wherein the transmitter and the receiver are not active at the same time.

* * * * *